(12) United States Patent
Wang et al.

(10) Patent No.: US 9,337,779 B2
(45) Date of Patent: May 10, 2016

(54) OPERATIONAL TRANSCONDUCTANCE AMPLIFIER, RECONFIGURABLE FULLY DIFFERENTIAL VOLTAGE SENSING AMPLIFIER AND RECONFIGURABLE FULLY DIFFERENTIAL CAPACITIVE SENSING AMPLIFIER

(71) Applicant: National Taiwan University of Science and Technology, Taipei (TW)

(72) Inventors: Tzu-Yun Wang, Taipei (TW); Min-Rui Lai, Taipei (TW); Sheng-Yu Peng, Taipei (TW)

(73) Assignee: NATIONAL TAIWAN UNIVERSITY OF SCIENCE AND TECHNOLOGY, Taipei (TW)

( * ) Notice: Subject to any disclaimer, the term of this patent is extended or adjusted under 35 U.S.C. 154(b) by 14 days.

(21) Appl. No.: 14/321,769

(22) Filed: Jul. 1, 2014

(65) Prior Publication Data
US 2015/0200635 A1    Jul. 16, 2015

(30) Foreign Application Priority Data
Jan. 16, 2014   (TW) .............................. 103101645 A

(51) Int. Cl.
| | | |
|---|---|---|
| H03F 1/02 | (2006.01) | |
| H03F 1/22 | (2006.01) | |
| H03F 3/45 | (2006.01) | |

(52) U.S. Cl.
CPC ............. *H03F 1/0272* (2013.01); *H03F 1/223* (2013.01); *H03F 3/4565* (2013.01);
(Continued)

(58) Field of Classification Search
CPC ............ H03F 3/45659; H03F 3/45183; H03F 3/45475; H03F 3/45479; H03F 2203/45424; H03F 3/45179; H03F 3/45192; H03F 3/45188; H03F 3/45085; H03F 3/45071; H03F 2200/294; H03F 2203/45418; H03F 2203/45512; H03F 2200/411; H03F 2203/45116; H03F 2203/45526; H03F 3/45654; H03F 2200/453; H03F 3/4565
USPC .................................................. 330/253–261
See application file for complete search history.

(56) References Cited

U.S. PATENT DOCUMENTS 5,847,600 A * 12/1998 Brooks et al. ................. 330/258
8,427,237 B2 * 4/2013 Hong ............................ 330/258
(Continued)

OTHER PUBLICATIONS

Reid R. Harrison and Cameron Charles, A Low-Power Low-Noise CMOS Amplifier for Neural Recording Applications, IEEE Journal of Solid-State Circuits, vol. 38, No. 6, Jun. 2003, p. 958-965.
(Continued)

*Primary Examiner* — Khanh V Nguyen
(74) *Attorney, Agent, or Firm* — CKC & Partners Co., Ltd.

(57) ABSTRACT

An operational transconductance amplifier includes a cascode differential-pair amplifying circuit, a bias driving circuit, and a common mode feedback circuit. The cascode differential-pair amplifying circuit is configured for receiving a differential input voltage and for providing a differential output voltage. The bias driving circuit is configured for providing a first bias current to drive the cascode differential-pair amplifying circuit and for adjusting the transconductance of the transconductance amplifier. The bias driving circuit includes a first floating-gate transistor. The first floating-gate transistor is configured for adjusting the first bias current. The common mode feedback circuit is configured for adjusting a second bias current of the cascode differential-pair amplifying circuit according to the differential output voltage so that the differential output voltage is stabilized. A reconfigurable fully differential voltage sensing amplifier and a reconfigurable fully differential capacitive sensing amplifier are disclosed herein as well.

9 Claims, 5 Drawing Sheets

(52) U.S. Cl.
CPC ....... *H03F 3/45188* (2013.01); *H03F 3/45228* (2013.01); *H03F 3/45475* (2013.01); *H03F 3/45* (2013.01); *H03F 3/45479* (2013.01); *H03F 2203/45082* (2013.01); *H03F 2203/45292* (2013.01); *H03F 2203/45311* (2013.01); *H03F 2203/45352* (2013.01); *H03F 2203/45404* (2013.01); *H03F 2203/45512* (2013.01); *H03F 2203/45522* (2013.01); *H03F 2203/45528* (2013.01); *H03F 2203/45544* (2013.01); *H03F 2203/45631* (2013.01)

(56) References Cited

U.S. PATENT DOCUMENTS

| | | | |
|---|---|---|---|
| 8,928,406 B2* | 1/2015 | Albinet | 330/258 |
| 2014/0197887 A1* | 7/2014 | Hovesten et al. | 330/255 |

OTHER PUBLICATIONS

Woradorn Wattanapanitch, Michale Fee and Rahul Sarpeshkar, An Energy-Efficient Micropower Neural Recording Amplifier, IEEE Transactions on Biomedical Circuits and Systems, vol. 1, No. 2, Jun. 2007, p. 136-147.

Vahid Majidzadeh, Alexandre Schmid and Yusuf Leblebici, Energy Efficient Low-Noise Neural Recording Amplifier With Enhanced Noise Efficiency Factor, IEEE Transactions on Biomedical Circuits and Systems, vol. 5, No. 3, Jun. 2011, p. 262-271.

L. Liu, X. Zou, W.L. Goh, R. Ramamoorthy, G. Dawe and M. Je, 800 nW 43 nV/pHz neural recording amplifier with enhanced noise efficiency factor, Electronics Letters, vol. 48, No. 9, Apr. 26, 2012.

Yuhwai Tseng, Yingchieh Ho, Shuoting Kao, and Chauchin Su, A 0.09 W Low Power Front-End Biopotential Amplifier for Biosignal Recording, IEEE Transactions on Biomedical Circuits and Systems, vol. 6, No. 5, Oct. 2012, p. 508-516.

Fan Zhang; Holleman, J.; Otis, B.P., "Design of Ultra-Low Power Biopotential Amplifiers for Biosignal Acquisition Applications," IEEE Transactions on Biomedical Circuits and Systems, vol. 6, No. 4 pp. 344-355, Aug. 2012.

Graham, D.W.; Farquhar, Ethan; Degnan, B.; Gordon, C.; Hasler, P. "Indirect Programming of Floating-Gate Transistors," IEEE Transactions on Circuits and Systems I: Regular Papers, vol. 54, No. 5 pp. 951-963, May 2007.

Srinivasan, V.; Serrano, G.J.; Gray, J.; Hasler, P. "A Precision CMOS Amplifier Using Floating-Gate Transistors for Offset Cancellation," IEEE Journal of Solid-State Circuits, vol. 42, No. 2 pp. 280-291, Feb. 2007.

* cited by examiner

OPERATIONAL TRANSCONDUCTANCE AMPLIFIER, RECONFIGURABLE FULLY DIFFERENTIAL VOLTAGE SENSING AMPLIFIER AND RECONFIGURABLE FULLY DIFFERENTIAL CAPACITIVE SENSING AMPLIFIER

RELATED APPLICATIONS

This application claims priority to Taiwan Application SeriCal Number 103101645, filed Jan. 16, 2014, the entirety of which is herein incorporated by reference.

BACKGROUND

1. Technical Field

The present disclosure relates to a reconfigurable fully differential amplifier. More particularly, the present disclosure relates to an operational transconductance amplifier of the reconfigurable fully differential amplifier.

2. Description of Related Art

As the development of the applications of sensing devices, the demands for low-power, low-noise amplifying circuits are increasing nowadays. For example, low-noise amplifying circuits are required in biomedical sensing devices or environmental sensing devices such that the weak signals detected from creatures or natural environments can be amplified. Moreover, amplifying circuits in portable or injectable biomedical sensing devices also have to meet requirement for low-power consumption.

However, the power consumption and the noise generated in conventional amplifying circuits are not satisfactory when the conventional amplifying circuits are applied in the abovementioned applications. Therefore it is very important in this field to design a novel low-power and low-noise amplifying circuit.

SUMMARY

In one aspect, the present disclosure is related to an operational transconductance amplifier. The operational transconductance amplifier includes a cascode differential-pair amplifying circuit, a bias driving circuit and a common mode feedback circuit. The cascode differential-pair amplifying circuit is configured for receiving a differential input voltage, and for providing a differential output voltage. The bias driving circuit is electrically connected with the cascode differential-pair amplifying circuit. The bias driving circuit is configured for providing a first bias current to drive the cascode differential-pair amplifying circuit, and for adjusting the transconductance value of the operational transconductance amplifier, in which the bias driving circuit includes a first floating-gate transistor. The first floating-gate transistor is configured for adjusting the first bias current. The common mode feedback circuit is electrically connected with the cascode differential-pair amplifying circuit. The common mode feedback circuit is configured for adjusting a second bias current of the cascade differential-pair amplifying circuit according to the differential output voltage so that the differential output voltage is stabilized.

According to one embodiment of this disclosure, the abovementioned common mode feedback circuit includes a second floating-gate transistor. The second floating-gate transistor is configured for adjusting the second bias current.

According to one embodiment of this disclosure, the abovementioned cascade differential-pair amplifying circuit includes a first PMOS transistor, a second PMOS transistor, a first NMOS transistor, a second NMOS transistor, a third PMOS transistor, a fourth PMOS transistor, a third NMOS transistor and a fourth NMOS transistor. The source of the second PMOS transistor is electrically connected with the source of the first PMOS transistor. The source of the second NMOS transistor is electrically connected with the source of the first NMOS transistor. The gate of the first PMOS transistor, of the second PMOS transistor, of the first NMOS transistor, and of the second NMOS transistor is configured for receiving the differential input voltage. The source of the third PMOS transistor is electrically connected with the drain of the first PMOS transistor. The source of the fourth PMOS transistor is electrically connected with the drain of the second PMOS transistor. The source of the third NMOS transistor is electrically connected with the drain of the first NMOS transistor. The source of the fourth NMOS transistor is electrically connected with the drain of the second NMOS transistor. The drain of the third PMOS transistor, of the fourth PMOS transistor, of the third NMOS transistor, and of the fourth NMOS transistor is configured for outputting the differential output voltage.

In another aspect, the present disclosure is related to a fully differential voltage sensing amplifier. The fully differential voltage sensing amplifier includes an operational transconductance amplifier, a first feedback resistor, a first feedback capacitor, a second feedback resistor, a second feedback capacitor, a first input capacitor and a second input capacitor. The operational transconductance amplifier includes a cascode differential-pair amplifying circuit, a bias driving circuit and a common mode feedback circuit. The cascade differential-pair amplifying circuit is configured for receiving a differential input voltage, and for providing a differential output voltage. The bias driving circuit is electrically connected with the cascode differential-pair amplifying circuit. The bias driving circuit is configured for providing a first bias current to drive the cascode differential-pair amplifying circuit, and for adjusting the transconductance of the operational transconductance amplifier, in which the bias driving circuit includes a first floating-gate transistor. The first floating-gate transistor is configured for adjusting the first bias current. The common mode feedback circuit is electrically connected with the cascade differential-pair amplifying circuit. The common mode feedback circuit is configured for adjusting a second bias current of the cascade differential-pair amplifying circuit according to the differential output voltage so that the differential output voltage is stabilized. The first feedback capacitor is electrically connected with the first feedback resistor in parallel, and the first feedback capacitor is coupled between a first input node and a first output node of the operational transconductance amplifier. The second feedback capacitor is electrically connected with the second feedback resistor in parallel, and the second feedback capacitor is coupled between a second input node and a second output node of the operational transconductance amplifier. The first input capacitor is coupled between a first input node of the fully differential voltage sensing amplifier and the first input node of the operational transconductance amplifier. The second input capacitor is coupled between a second input node of the fully differential voltage sensing amplifier and the second input node of the operational transconductance amplifier.

According to one embodiment of this disclosure, the abovementioned common mode feedback circuit includes a second floating-gate transistor. The second floating-gate transistor is configured for adjusting the second bias current.

According to one embodiment of this disclosure, the abovementioned fully differential voltage sensing amplifier further includes a first loading capacitor and a second loading capacitor. A node of the first loading capacitor is electrically connected with the first output node of the operational transconductance amplifier. A node of the second loading capacitor is electrically connected with the second output node of the operational transconductance amplifier.

According to one embodiment of this disclosure, the abovementioned first feedback capacitor and second feedback capacitor are adjustable capacitors.

According to one embodiment of this disclosure, the abovementioned first feedback resistor and second feedback resistor are adjustable resistors.

According to one embodiment of this disclosure, the abovementioned cascode differential-pair amplifying circuit includes a first PMOS transistor, a second PMOS transistor, a first NMOS transistor, a second NMOS transistor, a third PMOS transistor, a fourth PMOS transistor, a third NMOS transistor and a fourth NMOS transistor. The source of the second PMOS transistor is electrically connected with the source of the first PMOS transistor. The source of the second NMOS transistor is electrically connected with the source of the first NMOS transistor. The gate of the first PMOS transistor, of the second PMOS transistor, of the first NMOS transistor, and of the second NMOS transistor is configured for receiving the differential input voltage. The source of the third PMOS transistor is electrically connected with the drain of the first PMOS transistor. The source of the fourth PMOS transistor is electrically connected with the drain of the second PMOS transistor. The source of the third NMOS transistor is electrically connected with the drain of the first NMOS transistor. The source of the fourth NMOS transistor is electrically connected with the drain of the second NMOS transistor. The drain of the third PMOS transistor, of the fourth PMOS transistor, of the third NMOS transistor, and of the fourth NMOS transistor is configured for outputting the differential output voltage.

In still another aspect, the present disclosure is related to a fully differential capacitive sensing amplifier. The fully differential capacitive sensing amplifier includes an operational transconductance amplifier, a first feedback resistor, a first feedback capacitor, a second feedback resistor and a second feedback capacitor. The operational transconductance amplifier includes a cascode differential-pair amplifying circuit, a bias driving circuit and a common mode feedback circuit. The cascode differential-pair amplifying circuit is coupled with a differential input capacitor. The cascode differential-pair amplifying circuit is configured for providing a differential output voltage according to the variation of electrical charges generated by the differential input capacitor. The bias driving circuit is electrically connected with the cascode differential-pair amplifying circuit. The bias driving circuit is configured for providing a first bias current to drive the cascode differential-pair amplifying circuit, and for adjusting the transconductance value of the operational transconductance amplifier, in which the bias driving circuit includes a first floating-gate transistor. The first floating-gate transistor is configured for adjusting the first bias current. The common mode feedback circuit is electrically connected with the cascode differential-pair amplifying circuit. The common mode feedback circuit is configured for adjusting a second bias current of the cascode differential-pair amplifying circuit according to the differential output voltage so that the differential output voltage is stabilized. The first feedback capacitor is electrically connected with the first feedback resistor in parallel, and the first feedback capacitor is coupled between a first input node and a first output node of the operational transconductance amplifier. The second feedback capacitor is electrically connected with the second feedback resistor in parallel, and the second feedback capacitor is coupled between a second input node and a second output node of the operational transconductance amplifier.

The advantages of applying the present disclosure include that by utilizing the bias driving circuit and the common mode feedback circuit composed of floating-gate transistors, the power consumed by the operational transconductance amplifier is reduced and more precise bias driving circuit is also provided. Therefore, the performance of the fully differential voltage sensing amplifier and of the fully differential capacitive sensing amplifier implemented by utilizing the disclosed operational transconductance amplifier is improved. Moreover, by programming the floating-gate transistors of the bias driving circuit and of the common mode feedback circuit, the transconductance value of the operational transconductance amplifier can be adjusted, and the bandwidth of the fully differential voltage sensing amplifier and of the fully differential capacitive sensing amplifier implemented by utilizing the operational transconductance amplifier can be adjusted accordingly. Furthermore, by imposing adjustable resistors and adjustable capacitors in the fully differential voltage sensing amplifier and the fully differential capacitive sensing amplifier, a high-pass frequency response with an adjustable corner frequency is provided, and hence DC offset voltages are isolated, and low-frequency interference and noise are filtered. By adjusting the capacitance values of the abovementioned capacitors, the gains of the fully differential voltage sensing amplifier and of the fully differential capacitive sensing amplifier can be adjusted accordingly. In other words, the disclosed fully differential voltage sensing amplifier and the disclosed fully differential capacitive sensing amplifier are reconfigurable low-power fully differential amplifiers. The circuits can be programmed and reconfigured to provide different bandwidths and gains according to different applications. According to computation results, the noise efficiency factor (NEF) of the disclosed fully differential voltage sensing amplifier is improved by 1.414 times compared with conventional amplifiers. In other words, a reconfigurable low-power low-noise fully differential voltage sensing amplifier can be realized by applying the structures disclosed in the above embodiments.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
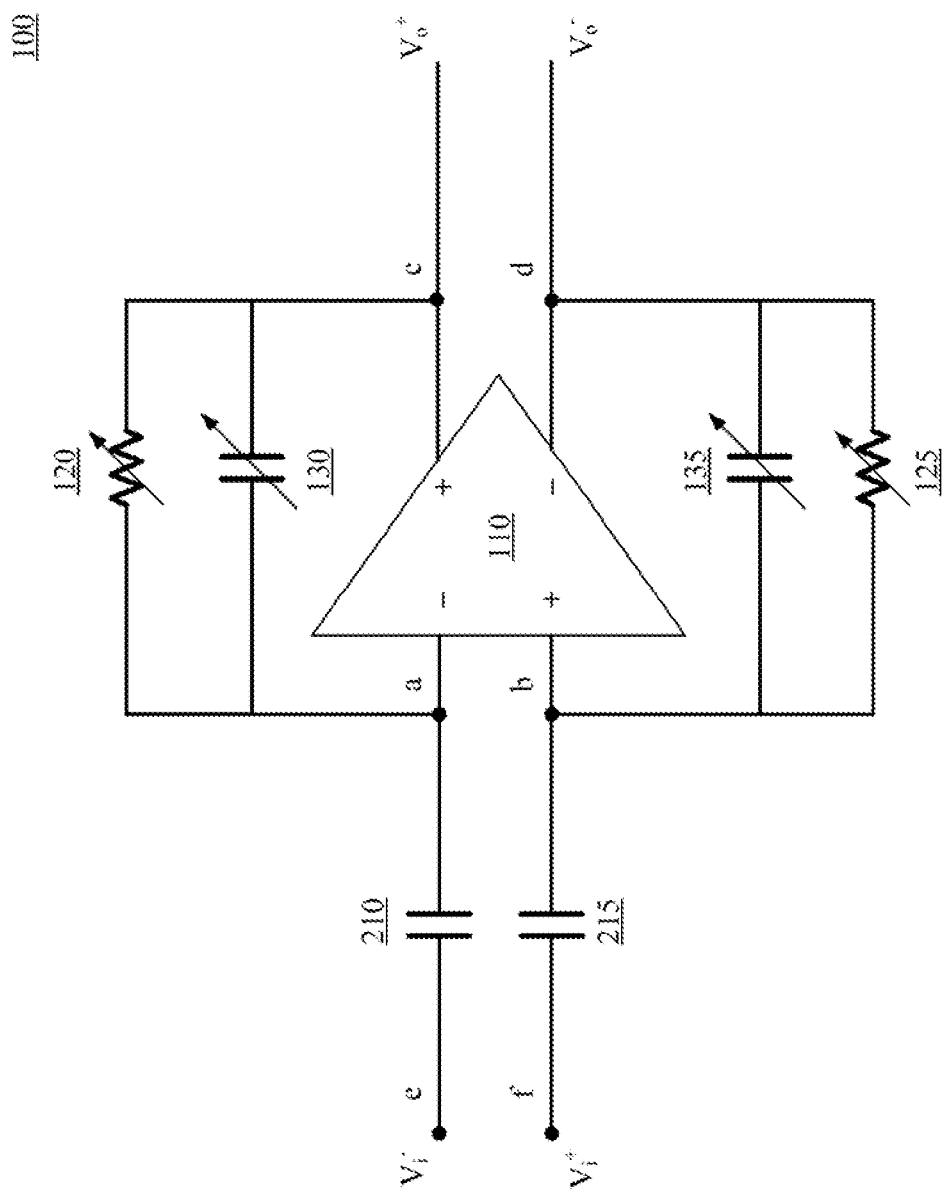
FIG. 1 is a block diagram of a fully differential voltage sensing amplifier in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. "Coupled" and "connected" may still be used to indicate that two or more elements cooperate or interact with each other.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Reference is made first to FIG. 1. FIG. 1 is a block diagram of a fully differential voltage sensing amplifier 100 in accordance with one embodiment of the present disclosure.

The fully differential voltage sensing amplifier 100 is configured for receiving a differential input voltage $V_i^+$ and $V_i^-$, and for outputting a differential output voltage $V_o^+$ and $V_o^-$. The fully differential voltage sensing amplifier 100 includes an operational transconductance amplifier 110, a feedback resistor 120, a feedback resistor 125, a feedback capacitor 130, a feedback capacitor 135, an input capacitor 210 and an input capacitor 215.

An input node e and an input node f of the fully differential voltage sensing amplifier 100 are configured for receiving the differential input voltage $V_i^+$ and $V_i^-$, respectively. The input capacitor 210 is coupled between the input node e of the fully differential voltage sensing amplifier 100 and an input node a of the operational transconductance amplifier 110. The input capacitor 215 is coupled between the input node f of the fully differential voltage sensing amplifier 100 and an input node b of the operational transconductance amplifier 110. An output node c and an output node d of the operational transconductance amplifier 110 are configured for outputting the differential output voltage $V_o^+$ and $V_o^-$, respectively.

The feedback capacitor 130 is electrically connected with the feedback resistor 120 in parallel. The feedback capacitor 130 is coupled between the input node a and the output node c of the operational transconductance amplifier 110. The feedback capacitor 135 is electrically connected with the feedback resistor 125 in parallel, and the feedback capacitor 135 is coupled between the input node b and the output node d of the operational transconductance amplifier 110.

The feedback resistor 120, the feedback resistor 125, the feedback capacitor 130 and the feedback capacitor 135 provide a high-pass frequency response such that DC offset voltages are isolated, and low-frequency interference and noise are filtered. In an example, the resistance value of the feedback resistor 120 and of the feedback resistor 125 are both $R_f$, while the capacitance value of the feedback capacitor 130 and of the feedback capacitor 135 are both $C_f$, then the corner frequency of the abovementioned high-pass frequency response is $1/R_f C_f$. In an embodiment of the present disclosure, both the feedback resistor 120 and the feedback resistor 125 are adjustable resistors, and both the feedback capacitor 130 and the feedback capacitor 135 are adjustable capacitors. By adjusting the resistance values of the feedback resistor 120 and of the feedback resistor 125, and by adjusting the capacitance values of the feedback capacitor 130 and of the feedback capacitor 135, the abovementioned high-pass corner frequency will change accordingly.

In the present embodiment, the input capacitor 210 and the input capacitor 215 are configured for providing a gain for the fully differential voltage sensing amplifier 100. For example, the capacitance value of the input capacitor 210 and of the input capacitor 215 are both $C_{in}$, while the capacitance value of the feedback capacitor 130 and of the feedback capacitor 135 are both $C_f$, then the value of the gain of the fully differential voltage sensing amplifier 100 is $-C_{in}/C_f$.

In the present embodiment, the transconductance value of the operational transconductance amplifier 110 can be adjusted to change the bandwidth of the fully differential voltage sensing amplifier 100 according to practical needs.

Figure 2:
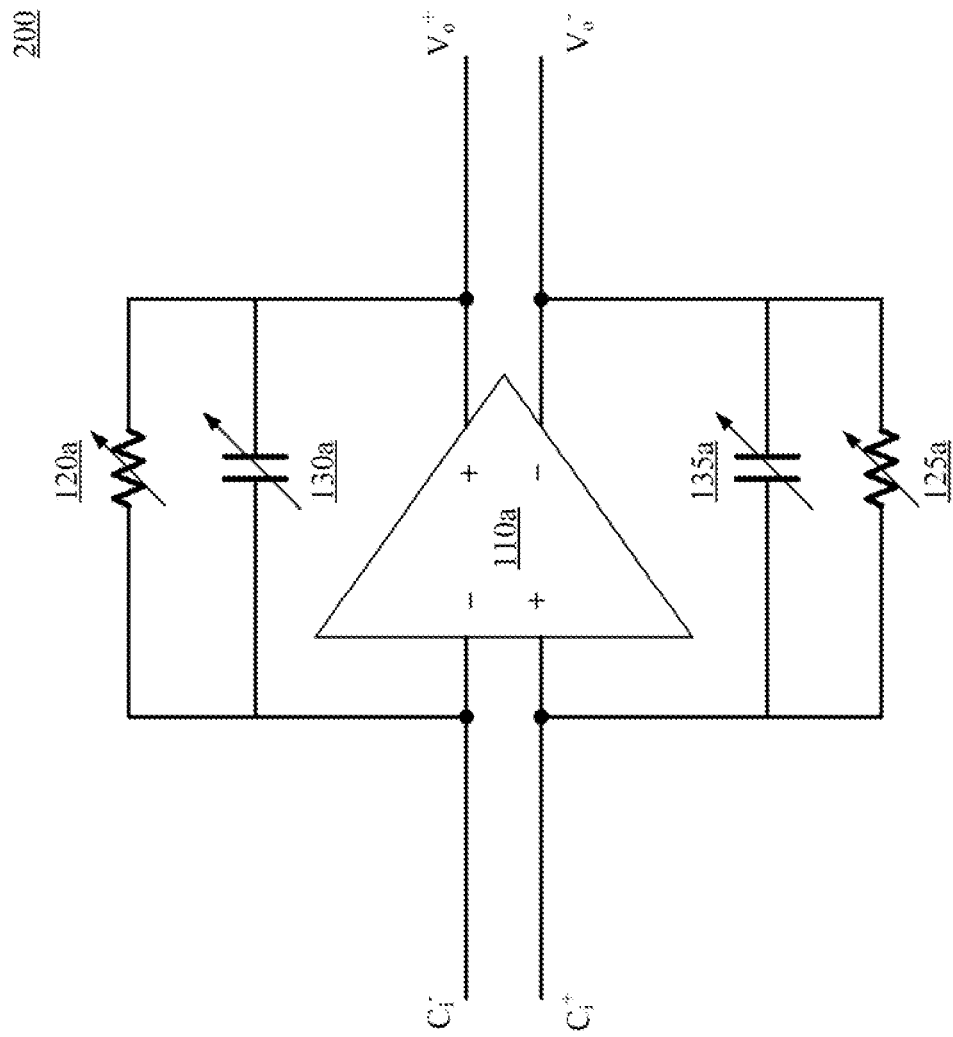
FIG. 2 is a block diagram of a fully differential capacitive sensing amplifier in accordance with one embodiment of the present disclosure.

Reference is made also to FIG. 2. FIG. 2 is a block diagram of a fully differential capacitive sensing amplifier 200 in accordance with one embodiment of the present disclosure.

The fully differential capacitive sensing amplifier 200 is configured for receiving a differential input capacitance $C_i^+$ and $C_i^-$, and for outputting a differential voltage $V_o^+$ and $V_o^-$. The fully differential capacitive sensing amplifier 200 can transform the variations of small capacitance values to the variations of voltage values, amplify and output the corresponding voltage signal.

The fully differential capacitive sensing amplifier 200 includes an operational transconductance amplifier 110a, a feedback resistor 120a, a feedback resistor 125a, a feedback capacitor 130a and a feedback capacitor 135a.

The operational transconductance amplifier 110a, the feedback resistor 120a, the feedback resistor 125a, the feedback capacitor 130a and the feedback capacitor 135a can be the operational transconductance amplifier 110, the feedback resistor 120, the feedback resistor 125, the feedback capacitor 130 and the feedback capacitor 135 illustrated in FIG. 1, respectively. Their functions and operations are similar and hence are not described again herein.

Figure 3:
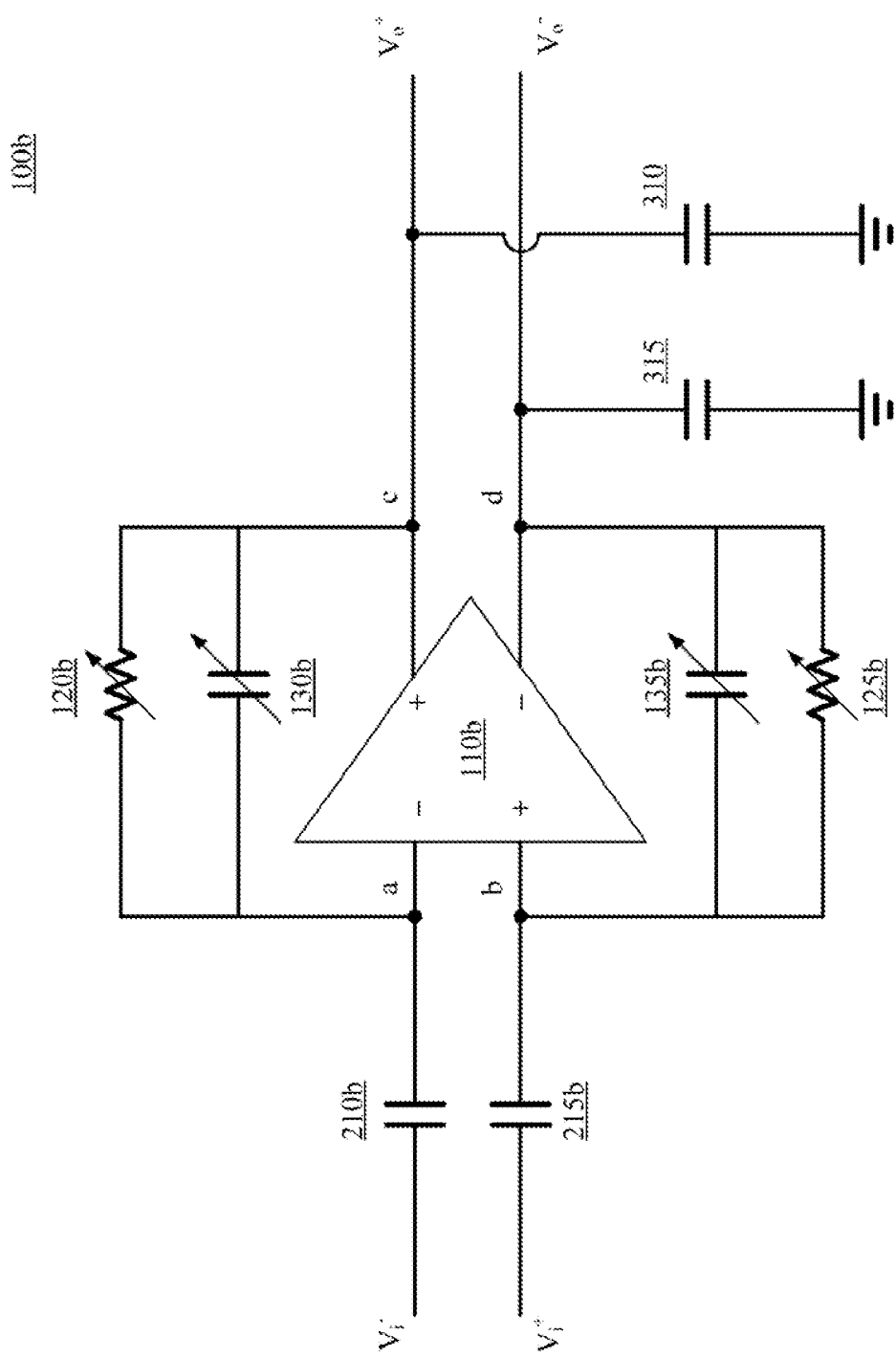
FIG. 3 is a block diagram of a fully differential voltage sensing amplifier in accordance with one embodiment of the present disclosure.

Additional reference is made to FIG. 3. FIG. 3 is a block diagram of a fully differential voltage sensing amplifier 100b in accordance with one embodiment of the present disclosure.

The fully differential voltage sensing amplifier 100b includes an operational transconductance amplifier 110b, a feedback resistor 120b, a feedback resistor 125b, a feedback capacitor 130b, a feedback capacitor 135b, an input capacitor 210b, an input capacitor 215b, a loading capacitor 310 and a loading capacitor 315.

The operational transconductance amplifier 110b, the feedback resistor 120b, the feedback resistor 125b, the feedback capacitor 130b, the feedback capacitor 135b, the input capacitor 210b and the input capacitor 215b can be the operational transconductance amplifier 110, the feedback resistor 120, the feedback resistor 125, the feedback capacitor 130, the feedback capacitor 135, the input capacitor 210 and the input capacitor 215 illustrated in FIG. 1, respectively. Their functions and operations are similar and hence are not described again herein.

As illustrated in FIG. 3, a node of the loading capacitor 310 is electrically connected with an output node c of the operational transconductance amplifier 110b, and a node of the loading capacitor 315 is electrically connected with an output node d of the operational transconductance amplifier 110b. In the present embodiment, the loading capacitor 310 and the loading capacitor 315 are configured for reducing the noise of the fully differential voltage sensing amplifier 100b.

Figure 4:
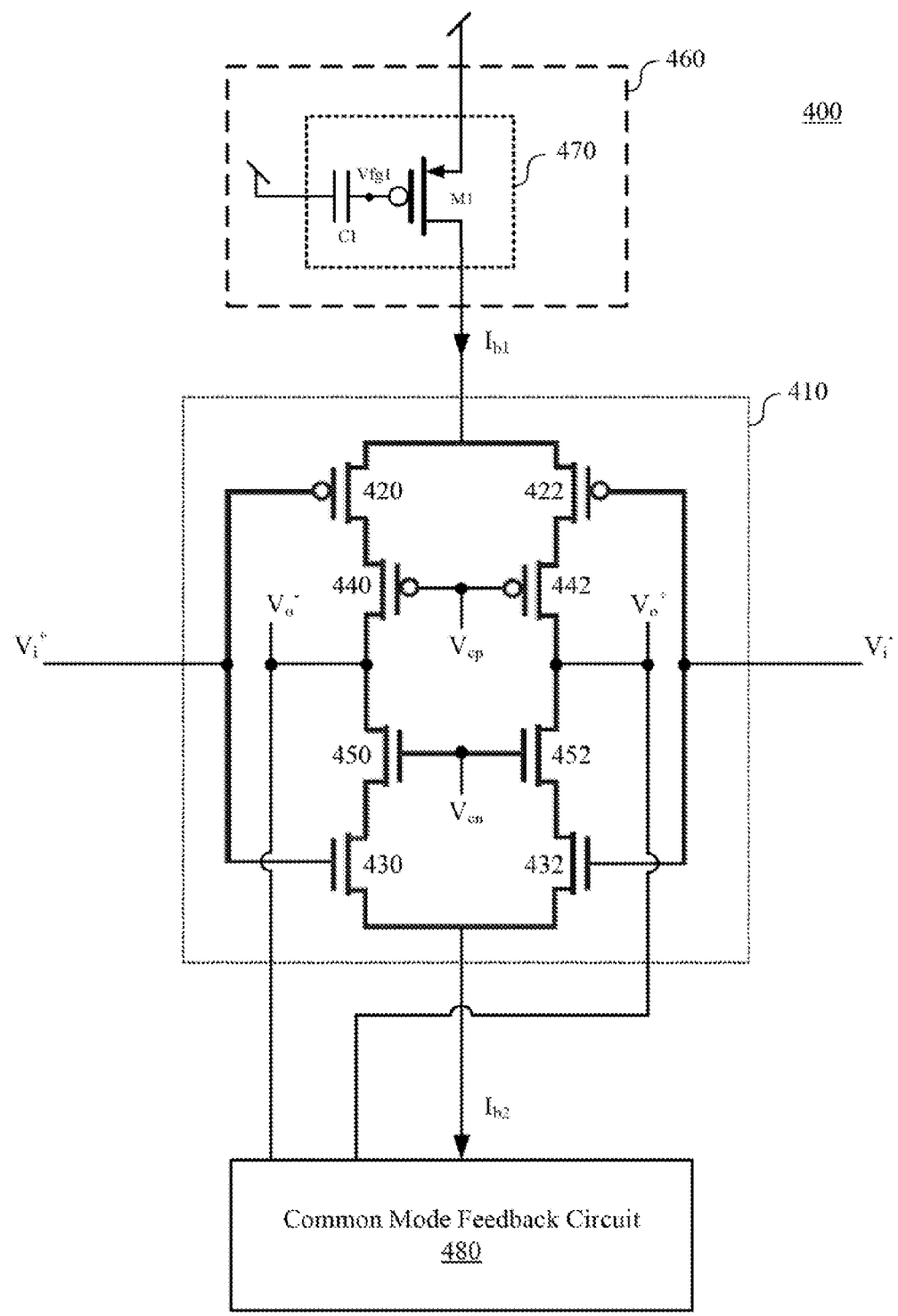
FIG. 4 is a circuit diagram of an operational transconductance amplifier in accordance with one embodiment of the present disclosure.

Reference is now made to FIG. 4. FIG. 4 is a circuit diagram of an operational transconductance amplifier 400 in accordance with one embodiment of the present disclosure. The operational transconductance amplifier 400 can be applied in, for example, the operational transconductance amplifier 110, 110a or 110b illustrated in FIG. 1, FIG. 2 or FIG. 3.

The operational transconductance amplifier 400 includes a cascode differential-pair amplifying circuit 410, a bias driving circuit 460 and a common mode feedback circuit 480.

The bias driving circuit 460 is electrically connected with the cascode differential-pair amplifying circuit 410. The bias driving circuit 460 is configured for providing a bias current $I_{b1}$ to drive the cascode differential-pair amplifying circuit 410, in which the bias current $I_{b1}$ can be adjusted such that the transconductance value of the operational transconductance amplifier 400 changes accordingly. When the value of the bias current $I_{b1}$ increases, the transconductance value of the operational transconductance amplifier 400 increases accordingly.

In the present embodiment, the bias driving circuit 460 includes a PMOS floating-gate transistor 470. The PMOS floating-gate transistor 470 includes a coupling capacitor C1 and a transistor M1. By adjusting the electrical charges stored in the coupling capacitor C1 of the PMOS floating-gate transistor 470, the floating-gate voltage level $V_{fg1}$ of the transistor M1 changes accordingly. Consequently, the bias current $I_{b1}$ changes accordingly, and the transconductance value of the operational transconductance amplifier 400 is adjusted.

Compared with conventional bias driving circuits which require reference current sources, in the present disclosure, by utilizing the PMOS floating-gate transistor 470, the currents consumed by the reference current sources in conventional bias driving circuits can be saved. Also, by adjusting the electrical charges stored in the coupling capacitor C1 of the PMOS floating-gate transistor 470 to change the floating-gate voltage level $V_{fg1}$ of the transistor M1 and the bias current $I_{b1}$, the flexibility and accuracy are better than conventional bias driving circuits.

The cascode differential-pair amplifying circuit 410 is configured for receiving a differential input voltage $V_i^+$ and $V_i^-$, and for outputting a differential output voltage $V_o^+$ and $V_o^-$. In the present embodiment, the cascode differential-pair amplifying circuit 410 includes PMOS transistors 420, 422, 440 and 442, and NMOS transistors 430, 432, 450 and 452.

The source of the PMOS transistor 420 is electrically connected with the source of the PMOS transistor 422, and is configured for receiving the bias circuit $I_{b1}$. The source of the NMOS transistor 430 is electrically connected with the source of the NMOS transistor 432, and is configured for outputting the bias circuit $I_{b2}$. The gates of the PMOS transistor 420 and of the NMOS transistor 430 are configured for receiving the differential input voltage $V_i^+$. The gates of the PMOS transistor 422 and of the NMOS transistor 432 are configured for receiving the differential input voltage $V_i^-$.

The source of the PMOS transistor 440 is electrically connected with the drain of the PMOS transistor 420. The source of the PMOS transistor 442 is electrically connected with the drain of the PMOS transistor 422. The gates of the PMOS transistor 440 and of the PMOS transistor 442 are configured for receiving a DC driving bias voltage $V_{cp}$. The source of the NMOS transistor 450 is electrically connected with the drain of the NMOS transistor 430. The source of the NMOS transistor 452 is electrically connected with the drain of the NMOS transistor 432. The gates of the NMOS transistor 450 and of the NMOS transistor 452 are configured for receiving a DC driving bias voltage $V_{cn}$. The drains of the PMOS transistor 440 and of the NMOS transistor 450 are configured for outputting the differential output voltage $V_o^-$. The drains of the PMOS transistor 442 and of the NMOS transistor 452 are configured for outputting the differential output voltage $V_o^+$.

It has to be explained that in the present embodiment, the PMOS transistor 440, the PMOS transistor 442, the NMOS transistor 450 and the NMOS transistor 452 are configured for increasing the gain of the operational transconductance amplifier 400. Skilled persons can decide whether it is necessary to impose the above transistors.

The common mode feedback circuit 480 is electrically connected with the cascode differential-pair amplifying circuit 410. The common mode feedback circuit 480 is configured for receiving the differential output voltage $V_o^+$ and $V_o^-$, and for adjusting the bias current $I_{b2}$ according to the differential output voltage $V_o^+$ and $V_o^-$, so that the current values of $I_{b2}$ and $I_{b1}$ are set to be equal and hence the differential output voltage $V_o^+$ and $V_o^-$ is stabilized. Consequently, the transistors of the cascode differential-pair amplifying circuit 410 work stably within preferred operation regions.

It has to be explained that in FIG. 4, the position of the bias driving circuit 460 and the position of the common mode feedback circuit 480 can be exchanged. In another embodiment (not depicted), an operational transconductance amplifier is provided with the bias current $I_{b2}$ to drive the cascode differential-pair amplifying circuit by a bias driving circuit imposed below the cascode differential-pair amplifying circuit. The differential output voltage $V_o^+$ and $V_o^-$ of the operational transconductance amplifier is received by a common mode feedback circuit imposed above the cascode differential-pair amplifying circuit. The common mode feedback circuit is configured for adjusting the bias current $I_{b1}$ according to the differential output voltage $V_o^+$ and $V_o^-$, so that the current values of $I_{b1}$ and $I_{b2}$ are set to be equal and hence the differential output voltage $V_o^+$ and $V_o^-$ is stabilized. Consequently, the transistors of the cascade differential-pair amplifying circuit work stably within preferred operation regions.

Figure 5:
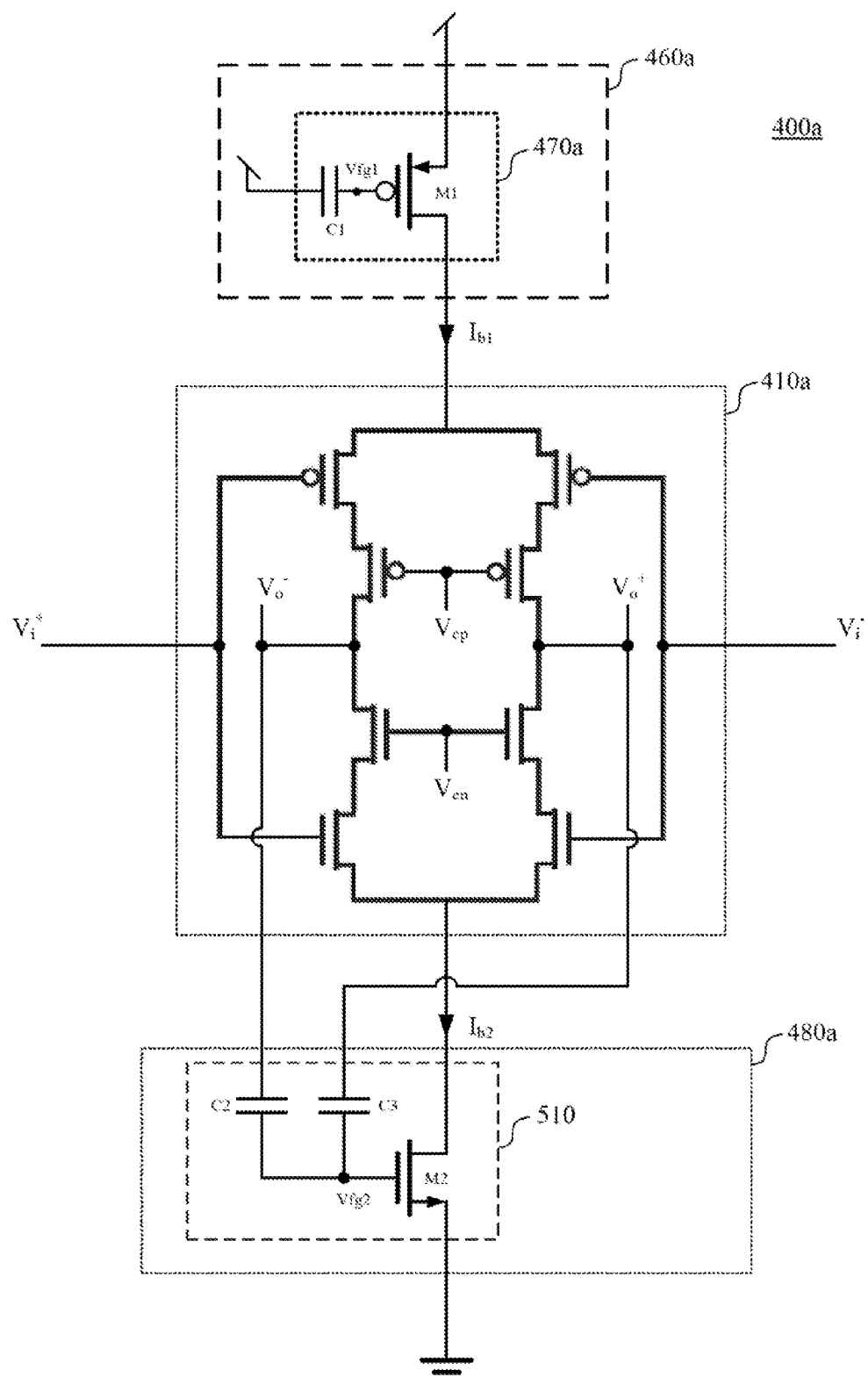
FIG. 5 is a circuit diagram of an operational transconductance amplifier in accordance with one embodiment of the present disclosure.

Reference is also made to FIG. 5. FIG. 5 is a circuit diagram of an operational transconductance amplifier 400a in accordance with one embodiment of the present disclosure. The operational transconductance amplifier 400a can be applied in, for example, the operational transconductance amplifier 110, 110a or 110b illustrated in FIG. 1, FIG. 2 or FIG. 3.

The operational transconductance amplifier 400a includes a cascade differential-pair amplifying circuit 410a, a bias driving circuit 460a and a common mode feedback circuit 480a.

The cascade differential-pair amplifying circuit 410a and the bias driving circuit 460a can be the cascade differential-pair amplifying circuit 410 and the bias driving circuit 460 illustrated in FIG. 4, respectively. Their functions and operations are similar and hence are not described again herein.

In the present embodiment, the common mode feedback circuit 480a includes a NMOS floating-gate transistor 510. The NMOS floating-gate transistor 510 includes a coupling capacitor C2, a coupling capacitor C3 and a transistor M2. By adjusting the electrical charges stored in the coupling capacitors C2 and C3 of the NMOS floating-gate transistor 510 according to the differential output voltage $V_o^+$ and $V_o^-$, the floating-gate voltage level $V_{fg2}$ of the transistor M2 changes accordingly. Consequently, the bias current $I_{b2}$ changes accordingly, so that the current values of $I_{b1}$ and $I_{b2}$ are set to be equal and hence the output voltage $V_o^+$ and $V_o^-$ is stabilized. Consequently, the output voltage of the invented amplifier can be stabilized at the desired level.

Conventional common mode feedback circuits require additional resistors and active components, and hence additional currents are consumed and circuit noise is generated. Also, the area and complexity of the common mode feedback circuits are increased. In the present disclosure, by utilizing the NMOS floating-gate transistor 510, additional power consumed by conventional common mode feedback circuits is reduced and no additional circuit noise is generated. Also, the implementation and the area of the circuit is easier.

According to the above embodiments, in the present disclosure, by utilizing the bias driving circuit and the common mode feedback circuit composed of floating-gate transistors, the power consumed by the operational transconductance amplifier is reduced and more precise bias driving circuit is also provided. Therefore, the performance of the fully differential voltage sensing amplifier and of the fully differential capacitive sensing amplifier implemented by utilizing the disclosed operational transconductance amplifier is improved. Moreover, by programming the floating-gate transistors of the bias driving circuit and of the common mode feedback circuit, the transconductance value of the operational transconductance amplifier can be adjusted, and the bandwidth of the fully differential voltage sensing amplifier and of the fully differential capacitive sensing amplifier implemented by utilizing the operational transconductance amplifier can be adjusted accordingly. Furthermore, by imposing adjustable resistors and adjustable capacitors in the fully differential voltage sensing amplifier and the fully differential capacitive sensing amplifier, a high-pass frequency response with an adjustable corner frequency is provided, and hence DC offset voltages are isolated, and low-frequency interference and noise are filtered. By adjusting the capacitance values of the abovementioned capacitors, the gains of the fully differential voltage sensing amplifier and of the fully differential capacitive sensing amplifier can be adjusted accordingly. In other words, the disclosed fully differential voltage sensing amplifier and the disclosed fully differential capacitive sensing amplifier are reconfigurable low-power fully differential amplifiers. The circuits can be programmed and reconfigured to provide different bandwidths and gains according to different applications.

According to computation results, by applying the operational transconductance amplifier 400a illustrated in FIG. 5 in the fully differential voltage sensing amplifier 100b illustrated in FIG. 3, the noise efficiency factor (NEF) of the fully differential voltage sensing amplifier 100b is improved by 1.414 times compared with conventional amplifiers. In other words, a reconfigurable low-power low-noise fully differential voltage sensing amplifier can be realized by applying the structures disclosed in the above embodiments.

The above illustrations include exemplary operations, but the operations are not necessarily performed in the order shown. Operations may be added, replaced, changed order, and/or eliminated as appropriate, in accordance with the spirit and scope of various embodiments of the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An operational transconductance amplifier, comprising:
    a cascode differential-pair amplifying circuit, configured for receiving a differential input voltage, and for providing a differential output voltage;
    a bias driving circuit, electrically connected with the cascode differential-pair amplifying circuit, the bias driving circuit being configured for providing a first bias current to drive the cascode differential-pair amplifying circuit, and for adjusting the transconductance value of the operational transconductance amplifier, wherein the bias driving circuit comprises a first floating-gate transistor, the first floating-gate transistor being configured for adjusting the first bias current; and
    a common mode feedback circuit, electrically connected with the cascode differential-pair amplifying circuit, the common mode feedback circuit being configured for adjusting a second bias current of the cascode differential-pair amplifying circuit according to the differential output voltage so that the differential output voltage is stabilized;
    wherein the common mode feedback circuit comprises a second floating-gate transistor, the second floating-gate transistor being configured for adjusting the second bias current.

2. The operational transconductance amplifier of claim 1, wherein the cascode differential-pair amplifying circuit comprises:
    a first PMOS transistor;
    a second PMOS transistor, wherein the source of the second PMOS transistor is electrically connected with the source of the first PMOS transistor;
    a first NMOS transistor;
    a second NMOS transistor, wherein the source of the second NMOS transistor is electrically connected with the source of the first NMOS transistor, and the gate of the first PMOS transistor, of the second PMOS transistor, of the first NMOS transistor, and of the second NMOS transistor being configured for receiving the differential input voltage;

a third PMOS transistor, wherein the source of the third PMOS transistor is electrically connected with the drain of the first PMOS transistor;

a fourth PMOS transistor, wherein the source of the fourth PMOS transistor is electrically connected with the drain of the second PMOS transistor;

a third NMOS transistor, wherein the source of the third NMOS transistor is electrically connected with the drain of the first NMOS transistor; and a fourth NMOS transistor, wherein the source of the fourth NMOS transistor is electrically connected with the drain of the second NMOS transistor, and the drain of the third PMOS transistor, of the fourth PMOS transistor, of the third NMOS transistor, and of the fourth NMOS transistor being configured for outputting the differential output voltage.

3. A fully differential voltage sensing amplifier, comprising:

an operational transconductance amplifier, the operational transconductance amplifier comprising:

a cascode differential-pair amplifying circuit, configured for receiving a differential input voltage, and for providing a differential output voltage;

a bias driving circuit, electrically connected with the cascode differential-pair amplifying circuit, the bias driving circuit being configured for providing a first bias current to drive the cascode differential-pair amplifying circuit, and for adjusting the transconductance of the operational transconductance amplifier, wherein the bias driving circuit comprises a first floating-gate transistor, the first floating-gate transistor being configured for adjusting the first bias current; and a common mode feedback circuit, electrically connected with the cascode differential-pair amplifying circuit, the common mode feedback circuit being configured for adjusting a second bias current of the cascode differential-pair amplifying circuit according to the differential output voltage so that the differential output voltage is stabilized;

a first feedback resistor;

a first feedback capacitor, wherein the first feedback capacitor is electrically connected with the first feedback resistor in parallel, and the first feedback capacitor being coupled between a first input node and a first output node of the operational transconductance amplifier;

a second feedback resistor;

a second feedback capacitor, wherein the second feedback capacitor is electrically connected with the second feedback resistor in parallel, and the second feedback capacitor being coupled between a second input node and a second output node of the operational transconductance amplifier;

a first input capacitor, wherein the first input capacitor is coupled between a first input node of the fully differential voltage sensing amplifier and the first input node of the operational transconductance amplifier; and a second input capacitor, wherein the second input capacitor is coupled between a second input node of the fully differential voltage sensing amplifier and the second input node of the operational transconductance amplifier.

4. The fully differential voltage sensing amplifier of claim 3, wherein the common mode feedback circuit comprises a second floating-gate transistor, the second floating-gate transistor being configured for adjusting the second bias current.

5. The fully differential voltage sensing amplifier of claim 3 further comprising:

a first loading capacitor, wherein a node of the first loading capacitor is electrically connected with the first output node of the operational transconductance amplifier; and a second loading capacitor, wherein a node of the second loading capacitor is electrically connected with the second output node of the operational transconductance amplifier.

6. The fully differential voltage sensing amplifier of claim 3, wherein the first feedback capacitor and the second feedback capacitor are adjustable capacitors.

7. The fully differential voltage sensing amplifier of claim 3, wherein the first feedback resistor and the second feedback resistor are adjustable resistors.

8. The fully differential voltage sensing amplifier of claim 3, wherein the cascode differential-pair amplifying circuit comprises:

a first PMOS transistor;

a second PMOS transistor, wherein the source of the second PMOS transistor is electrically connected with the source of the first PMOS transistor;

a first NMOS transistor;

a second NMOS transistor, wherein the source of the second NMOS transistor is electrically connected with the source of the first NMOS transistor, and the gate of the first PMOS transistor, of the second PMOS transistor, of the first NMOS transistor, and of the second NMOS transistor being configured for receiving the differential input voltage;

a third PMOS transistor, wherein the source of the third PMOS transistor is electrically connected with the drain of the first PMOS transistor;

a fourth PMOS transistor, wherein the source of the fourth PMOS transistor is electrically connected with the drain of the second PMOS transistor;

a third NMOS transistor, wherein the source of the third NMOS transistor is electrically connected with the drain of the first NMOS transistor; and a fourth NMOS transistor, wherein the source of the fourth NMOS transistor is electrically connected with the drain of the second NMOS transistor, and the drain of the third PMOS transistor, of the fourth PMOS transistor, of the third NMOS transistor, and of the fourth NMOS transistor being configured for outputting the differential output voltage.

9. A fully differential capacitive sensing amplifier comprising:

an operational transconductance amplifier, the operational transconductance amplifier comprising:

a cascode differential-pair amplifying circuit, being coupled with a differential input capacitor, the cascode differential-pair amplifying circuit being configured for providing a differential output voltage according to the variation of electrical charges generated by the differential input capacitor;

a bias driving circuit, electrically connected with the cascode differential-pair amplifying circuit, the bias driving circuit being configured for providing a first bias current to drive the cascode differential-pair amplifying circuit, and for adjusting the transconductance value of the operational transconductance amplifier, wherein the bias driving circuit comprises a first floating-gate transistor, the first floating-gate transistor being configured for adjusting the first bias current; and a common mode feedback circuit, electrically connected with the cascode differential-pair amplifying circuit, the common mode feedback circuit being configured for adjusting a second bias current of the cascode differential-pair amplifying circuit according to the differential output voltage so that the differential output voltage is stabilized;

a first feedback resistor;

a first feedback capacitor, wherein the first feedback capacitor is electrically connected with the first feedback resistor in parallel, and the first feedback capacitor being coupled between a first input node and a first output node of the operational transconductance amplifier;

a second feedback resistor; and a second feedback capacitor, wherein the second feedback capacitor is electrically connected with the second feedback resistor in parallel, and the second feedback capacitor being coupled between a second input node and a second output node of the operational transconductance amplifier.

* * * * *